US012733418B2

(12) United States Patent
Tanoue et al.

(10) Patent No.: US 12,733,418 B2
(45) Date of Patent: Sep. 8, 2026

(54) SUBSTRATE PROCESSING METHOD AND SUBSTRATE PROCESSING APPARATUS

(71) Applicant: Tokyo Electron Limited, Tokyo (JP)

(72) Inventors: Hayato Tanoue, Kikuchi-gun (JP); Yohei Yamashita, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 840 days.

(21) Appl. No.: 17/907,217

(22) PCT Filed: Mar. 2, 2021

(86) PCT No.: PCT/JP2021/007940
§ 371 (c)(1),
(2) Date: Nov. 20, 2023

(87) PCT Pub. No.: WO2021/192854
PCT Pub. Date: Sep. 30, 2021

(65) Prior Publication Data

US 2024/0087900 A1 Mar. 14, 2024

(30) Foreign Application Priority Data

Mar. 24, 2020 (JP) ................................ 2020-053183

(51) Int. Cl.
*H10P 34/42* (2026.01)
*B23K 26/062* (2014.01)
(Continued)

(52) U.S. Cl.
CPC .......... *H10P 34/42* (2026.01); *H10P 72/0436* (2026.01)

(58) Field of Classification Search
CPC ..... B23K 26/0622; B23K 26/53; H10P 10/12; H10P 34/42; H10P 72/0436;
(Continued)

(56) References Cited

U.S. PATENT DOCUMENTS

2002/0146893 A1 10/2002 Shimoda
2003/0224582 A1* 12/2003 Shimoda ................ H10D 86/60 257/E27.111
(Continued)

FOREIGN PATENT DOCUMENTS

CN 1199507 A 11/1998
JP H10125929 A 5/1998
(Continued)

OTHER PUBLICATIONS

International Search Report of PCT/JP2021/ 007940 dated Jun. 1, 2021.

*Primary Examiner* — Omar F Mojaddedi
(74) *Attorney, Agent, or Firm* — Shih IP Law Group, PLLC.

(57) ABSTRACT

A substrate processing method of a combined substrate in which a first substrate and a second substrate are bonded to each other is provided. A laser absorption layer is formed on the second substrate. The substrate processing method includes forming a separation modification layer by radiating a laser beam to the laser absorption layer in a pulse shape to accumulate a stress in the laser absorption layer; and separating the second substrate by releasing the accumulated stress in a chain manner.

26 Claims, 15 Drawing Sheets

(51) Int. Cl.
*B23K 26/53* (2014.01)
*H10P 72/00* (2026.01)
*H10P 95/00* (2026.01)

(58) Field of Classification Search
CPC ...... H10P 72/0428; H10P 95/00; H10P 95/11; H10P 90/1914; H10W 10/181
See application file for complete search history.

(56) References Cited

U.S. PATENT DOCUMENTS

| | | | | |
|---|---|---|---|---|
| 2005/0279736 | A1* | 12/2005 | Bruland | B23K 26/0613 257/E23.15 |
| 2007/0111478 | A1* | 5/2007 | Komura | B23K 26/40 257/E21.599 |
| 2016/0247868 | A1* | 8/2016 | Yamazaki | H10D 86/423 |
| 2020/0176415 | A1* | 6/2020 | Sakamoto | H10D 88/00 |
| 2020/0211850 | A1* | 7/2020 | Donofrio | H10P 10/128 |
| 2021/0147224 | A1* | 5/2021 | Fukumitsu | B81B 3/0021 |
| 2021/0296119 | A1 | 9/2021 | Tanoue | |
| 2021/0327772 | A1 | 10/2021 | Tanoue | |

FOREIGN PATENT DOCUMENTS

| | | | |
|---|---|---|---|
| JP | 2007-165848 | A | 6/2007 |
| JP | 2007-220749 | A | 8/2007 |
| JP | 2008-503877 | A | 2/2008 |
| JP | 2018-117060 | A | 7/2018 |
| JP | 2018-207009 | A | 12/2018 |
| WO | 2006009818 | A2 | 1/2006 |
| WO | 2019208298 | A1 | 10/2019 |
| WO | 2020017599 | A1 | 1/2020 |

* cited by examiner

R1
M1
Ac
Ad
Ae
L
P
D2
W2

R2
R1
M1
Ac
Ad
Ae
P
D2
W2

R2
R1
M1
Ac
Ad
Ae
P
D2
W2

*FIG. 8*
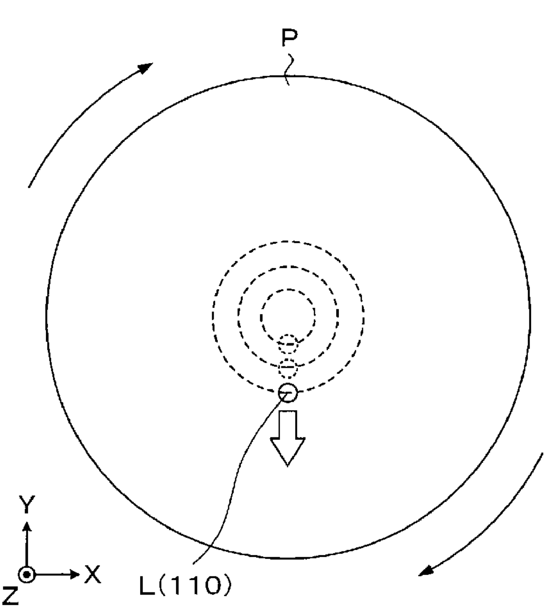
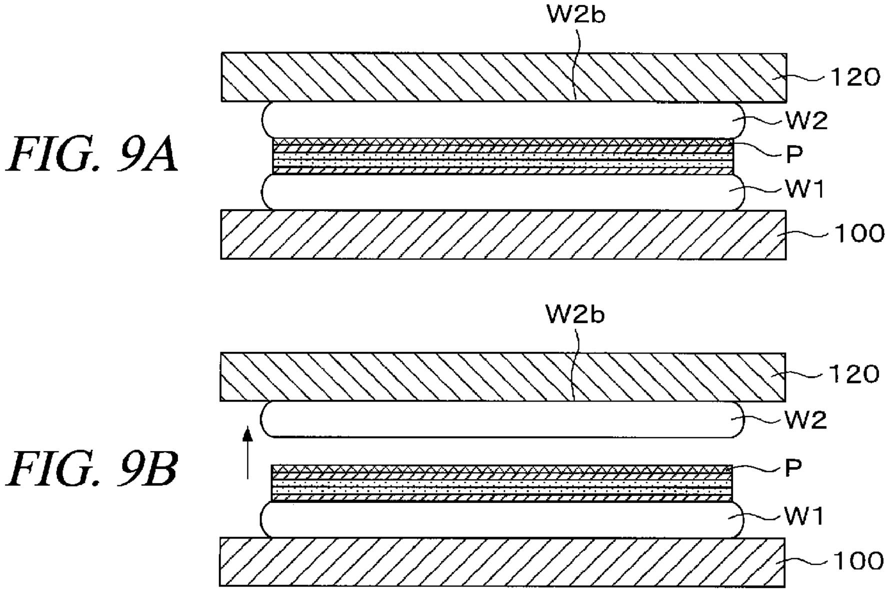
*FIG. 9A*
*FIG. 9B*

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2021/007940 filed on Mar. 2, 2021, which claims the benefit of Japanese Patent Application No. 2020-053183 filed on Mar. 24, 2020, the entire disclosures of which are incorporated herein by reference.

TECHNICAL FIELD

The various aspects and embodiments described herein pertain generally to a substrate processing method and a substrate processing apparatus.

BACKGROUND

Patent Document 1 discloses a manufacturing method for a semiconductor device. This manufacturing method for a semiconductor device includes: a heating process of locally heating a separation oxide film by radiating a $CO_2$ laser from a rear surface of a semiconductor substrate; and a transcribing process of transcribing a semiconductor element to a transcription destination substrate by causing separation in the separation oxide film and/or at an interface between the separation oxide film and the semiconductor substrate.

PRIOR ART DOCUMENT

Patent Document 1: Japanese Patent Laid-open Publication No. 2007-220749

DISCLOSURE OF THE INVENTION

Means for Solving the Problems

In an exemplary embodiment, there is provided a substrate processing method of a combined substrate in which a first substrate and a second substrate are bonded to each other. A laser absorption layer is formed on the second substrate. The substrate processing method includes forming a separation modification layer by radiating a laser beam to the laser absorption layer in a pulse shape to accumulate a stress in the laser absorption layer; and separating the second substrate by releasing the accumulated stress in a chain manner.

BRIEF DESCRIPTION OF THE DRAWINGS

FIG. 8 is a plan view illustrating another example of forming the separation modification layer according to the exemplary embodiment.

FIG. 9A and FIG. 9B are explanatory diagrams illustrating separation of a second wafer according to the exemplary embodiment.

FIG. 17A and FIG. 17B are plan views illustrating another example of forming the separation modification layer according to the exemplary embodiment.

DETAILED DESCRIPTION

Figure 1:
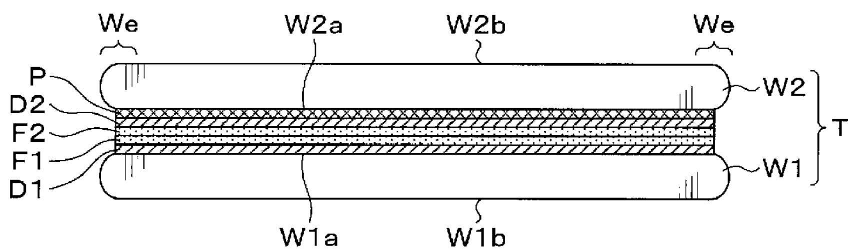
FIG. 1 is a side view illustrating an example of a combined wafer to be processed in a wafer processing system.

In recent years, in a manufacturing process for an LED, there is performed a so-called laser lift-off of separating a gallium nitride (GaN)-based compound crystal layer (material layer) from a sapphire substrate by using a laser beam. As for the background for why the laser lift-off is performed in this way, since the sapphire substrate is transmissive to laser beam (for example, UV light) having a short wavelength, laser beam of a short wavelength having a high absorptance for a absorption layer can be used. That is, the laser lift-off is advantageous in that it has a wide range of choices for the laser beam.

Meanwhile, in a manufacturing process for a semiconductor device, there is performed a process of transcribing a device layer formed on a front surface of one substrate (a silicon substrate such as semiconductor) to another substrate. The silicon substrate is generally transmissive to laser beam in a near infrared (NIR) range. Since, however, the absorption layer is also transmissive to the NIR laser beam, there is a risk that the device layer may be damaged. Thus, in order to perform the laser lift-off in the manufacturing process for the semiconductor device, laser beam in a far-infrared (FIR) range is used.

In general, the laser beam having the FIR wavelength may be used through, for example, a $CO_2$ laser. In the method described in the aforementioned Patent Document 1, by radiating the $CO_2$ laser to the separation oxide film as the absorption layer, separation occurs at an interface between the separation oxide film and the substrate.

Here, through intensive research, the present inventors have found out that simply radiating a laser beam ($CO_2$ laser) to the absorption layer is not enough to cause the separation of the substrate and the separation oxide film (device layer), that is, there are cases where transcription cannot be performed properly. That is, it is found out that the factor causing the separation is not an energy amount of the laser beam but a peak power (maximum intensity of the radiated laser beam) thereof. The peak power can be increased by, for example, reducing a frequency of the laser beam.

As described above, in order to cause the separation of the substrate and the absorption layer (device layer) by the radiation of the laser beam as in the method described in Patent Document 1, the peak power of the laser beam to be radiated to the absorption layer needs to be increased by, for example, lowering the frequency of the laser beam. However, when the frequency of the laser beam is lowered in this way, the time required to separate the substrate and the absorption layer in their entire surfaces increases, resulting in a decrease in a throughput related to the transcription of the device layer. In the method of Patent Document 1, nothing is considered or mentioned about the frequency of the laser beam, and there is no suggestion therefor, either. In this regard, there is still a room for improvement in the conventional device layer transcription method.

The present disclosure provides a technique enabling to appropriately separate a second substrate from a first substrate in a combined substrate in which the first substrate and the second substrate are bonded to each other. Hereinafter, a wafer processing system as a substrate processing apparatus and a wafer processing method as a substrate processing method according to an exemplary embodiment will be described with reference to the accompanying drawings. Further, in the specification and the drawings, parts having substantially the same functions and configurations will be assigned same reference numerals, and redundant description will be omitted.

As shown in FIG. 1, a combined wafer T as a combined substrate to be processed in a wafer processing according to the present exemplary embodiment is formed by bonding a first wafer W1 as a first substrate and a second wafer W2 as a second substrate to each other. Hereinafter, in the first wafer W1, a surface to be bonded to the second wafer W2 will be referred to as a front surface W1*a*, and a surface opposite to the front surface W1*a* will be referred to as a rear surface W1*b*. Likewise, in the second wafer W2, a surface to be bonded to the first wafer W1 will be referred to as a front surface W2*a*, and a surface opposite to the front surface W2*a* will be referred to as a rear surface W2*b*.

The first wafer W1 is a semiconductor wafer such as, but not limited to, a silicon wafer. A device layer D1 including a plurality of devices is formed on the front surface W1*a* of the first wafer W1. A surface film F1 is formed on the device layer D1, and the device layer D1 is bonded to the second wafer W2 with this surface film F1 therebetween. The surface film F1 may be, by way of non-limiting example, an oxide film (a $SiO_2$ film or a TEOS film), a SiC film, a SiCN film, an adhesive, or the like. Further, the device layer D and the surface film F1 may not be formed on the front surface W1*a*.

The second wafer W2 is also a semiconductor wafer such as, but not limited to, a silicon substrate. On the front surface W2*a* of the second wafer W2, a laser absorption layer P, a device layer D2, and a surface film F2 are stacked in this order from the front surface W2*a* side, and the device layer D2 is bonded to the first wafer W1 with the surface film F2 therebetween. The device layer D2 and the surface film F2 are the same as the device layer D1 and the surface film F1 of the first wafer W1, respectively. Examples of the laser absorption layer P include those capable of absorbing laser beam (for example, a $CO_2$ laser) as will be described later, such as an oxide film (a $SiO_2$ film, a TEOS film) or the like. Further, the laser absorption layer P, the device layer D2, and the surface film F2 may not be formed on the front surface W2*a*. In this case, the laser absorption layer P is formed on the front surface W1*a* of the first wafer W1 on which the device layer D1 and the surface film F1 are formed, and this device layer D1 is transcribed to the second wafer W2.

A peripheral portion We of the second wafer W2 is chamfered, and the thickness of this peripheral portion We decreases toward a leading end thereof on a cross section thereof. In the manufacturing process for the semiconductor device, the rear surface of the second wafer W2 having the above-described structure may be removed to thin the second wafer W2. In this thinning processing, the peripheral portion We may be given a sharply pointed shape (a so-called knife edge shape). Then, chipping may occur at the peripheral portion We of the second wafer W2, raising a risk that the second wafer W2 may be damaged. To solve the problem, edge trimming of removing the peripheral portion We of the second wafer W2 as will be described later may be performed before the thinning processing. The peripheral portion We is a portion to be removed in this edge trimming, and is in the range of, e.g., 0.5 mm to 3 mm from an edge of the second wafer W2 in a diametrical direction thereof.

In the wafer processing system 1 to be described later according to the present exemplary embodiment, the above-described laser lift-off processing as a wafer processing, that is, the processing of transcribing the device layer D2 to the first wafer W1, or the above-described edge trimming processing as a wafer processing, that is, the processing of removing the peripheral portion We of the second wafer W2 is performed.

Figure 2:
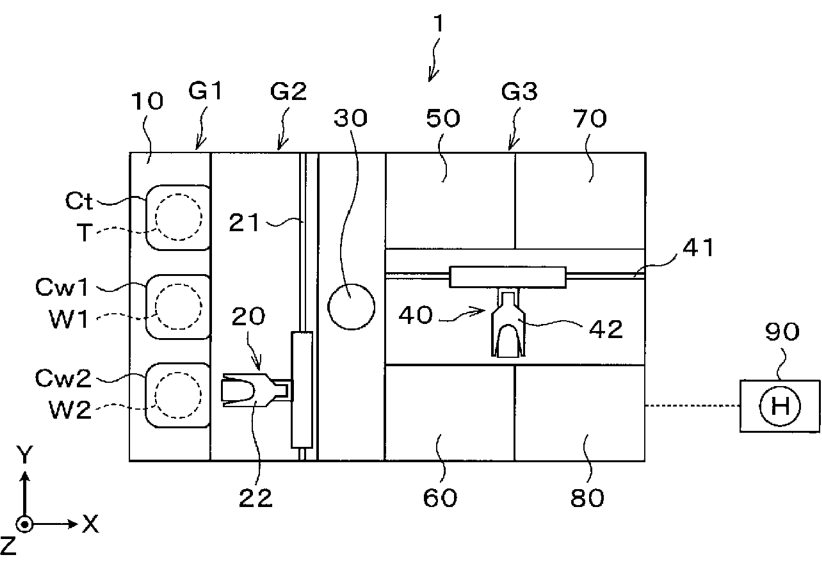
FIG. 2 is a plan view schematically illustrating a configuration of the wafer processing system.

As shown in FIG. 2, the wafer processing system 1 has a configuration in which a carry-in/out block G1, a transfer block G2, and a processing block G3 are connected as one body. The carry-in/out block G1, the transfer block G2, and the processing block G3 are arranged in this order from the negative X-axis side.

In the carry-in/out block G1, cassettes Ct, Cw1, and Cw2 capable of accommodating therein a plurality of combined wafers T, a plurality of first wafers W1, and a plurality of second wafers W2, respectively, are carried to/from, for example, the outside. In the carry-in/out block G1, a cassette placing table 10 is disposed. In the shown example, a plurality of, for example, three cassettes Ct, Cw1, and Cw2 can be arranged on the cassette placing table 10 in a row in the Y-axis direction. Here, the number of the cassettes Ct, Cw1, and Cw2 disposed on the cassette placing table 10 is not limited to the example of the present exemplary embodiment and may be selected as required.

The transfer block G2 is equipped with a wafer transfer device 20 which is disposed adjacent to the cassette placing table 10 on the positive X-axis side of the cassette placing table 10. The wafer transfer device 20 is configured to be movable on a transfer path 21 which is elongated in the Y-axis direction. Further, the wafer transfer device 20 has, for example, two transfer arms 22 configured to hold and transfer the combined wafer T, the first wafer W1, and the second wafer W2. Each transfer arm 22 is configured to be movable in a horizontal direction and a vertical direction and pivotable around a horizontal axis and a vertical axis. In addition, the structure of the transfer arm 22 is not limited to the example of the present exemplary embodiment, and various other structures may be adopted. Moreover, the wafer transfer device 20 is configured to transfer the combined wafer T, the first wafer W1 and the second wafer W2 to/from the cassettes Ct, Cw1 and Cw2 on the cassette placing table 10 and a transition device 30 to be described later.

The transfer block G2 is also equipped with, on the positive X-axis side of the wafer transfer device 20, the transition device 30. The transition device 30 is disposed adjacent to the wafer transfer device 20 and configured to deliver the combined substrate T, the first wafer W1, and the second wafer W2.

The processing block G3 has a wafer transfer device 40, a periphery removing apparatus 50, a cleaning apparatus 60, a laser radiation device 70 for inside (hereinafter, referred to as "internal laser radiation device 70"), and a laser radiation device 80 for interface (hereinafter, referred to as "interfacial laser radiation device 80").

The wafer transfer device 40 is configured to be movable on a transfer path 41 which is elongated in the X-axis direction. Further, the wafer transfer device 40 has, for example, two transfer arms 42 configured to hold and transfer the combined wafer T, the first wafer W1, and the second wafer W2. Each transfer arm 42 is configured to be movable in a horizontal direction and a vertical direction and pivotable around a horizontal axis and a vertical axis. In addition, the structure of the transfer arm 42 is not limited to the example of the present exemplary embodiment, and various other structures may be adopted. Further, the wafer transfer device 40 is configured to be capable of transferring the combined wafer T, the first wafer W1 and the second wafer W2 to/from the transition device 30, the periphery removing apparatus 50, the cleaning apparatus 60, the internal laser radiation device 70, and the interfacial laser radiation device 80.

The periphery removing apparatus 50 is provided on the positive Y-axis side of the wafer transfer device 40, and is configured to remove the peripheral portion We of the second wafer W2, that is, perform the edge trimming processing. The cleaning apparatus 60 is provided on the negative Y-axis side of the wafer transfer device 40, and is configured to perform cleaning of the combined wafer T after being subjected to the thinning processing or the removing of the peripheral portion We. The internal laser radiation device 70 as a second laser radiation unit is provided on the positive Y-axis side of the wafer transfer device 40, and radiates laser beam (laser beam for inside, for example, a YAG laser) to an inside of the second wafer W2 to form a peripheral modification layer M2 to be described later, which serves as a starting point for the removal of the peripheral portion We. The interfacial laser radiation device 80 is provided on the negative Y-axis side of the wafer transfer device 40, and radiates laser beam (laser beam for interface, for example, a $CO_2$ laser) to the laser absorption layer P formed on the front surface W2*a* of the second wafer W2. A configuration of the interfacial laser radiation device 80 will be elaborated later.

The above-described wafer processing system 1 is equipped with a control device 90 as a controller. The control device 90 is, for example, a computer, and has a program storage (not shown). A program for controlling a processing of the combined wafer T in the wafer processing system 1 is stored in the program storage. Further, the program storage also stores therein a program for implementing a wafer processing to be described later in the wafer processing system 1 by controlling operations of the above-described various kinds of processing apparatuses and a driving system such as the transfer devices. In addition, the programs may be recorded in a computer-readable recording medium H, and may be installed from this recording medium H to the control device 90.

The wafer processing system 1 is configured as described above. In this wafer processing system 1, the above-described laser lift-off processing for the combined wafer T, that is, the processing of transcribing the device layer D2 to the first wafer W1, and the above-described edge trimming processing for the second wafer W2 can be individually performed. Further, for example, when the edge trimming processing for the second wafer W2 is not performed in the wafer processing system 1, the periphery removing apparatus 50 and the internal laser radiation device 70 may be omitted.

Now, the aforementioned interfacial laser radiation device 80 will be explained.

Figure 3:
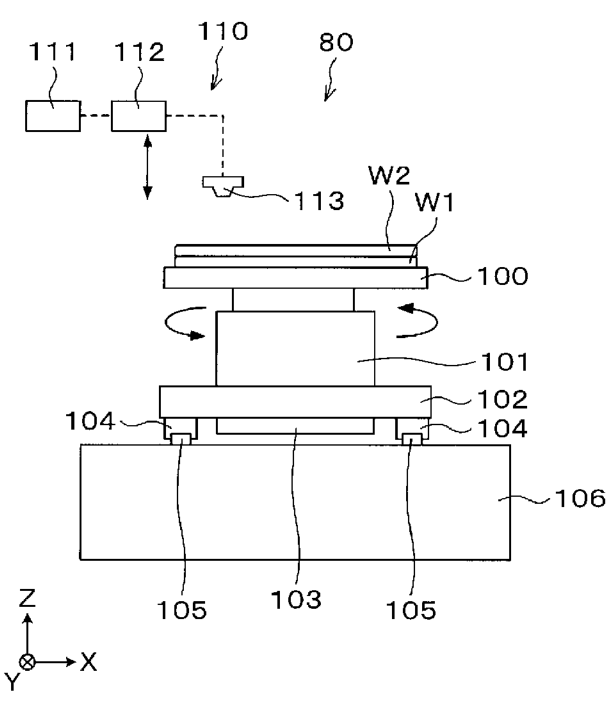
FIG. 3 is a side view illustrating a schematic configuration of an interfacial laser radiation device.
Figure 4:
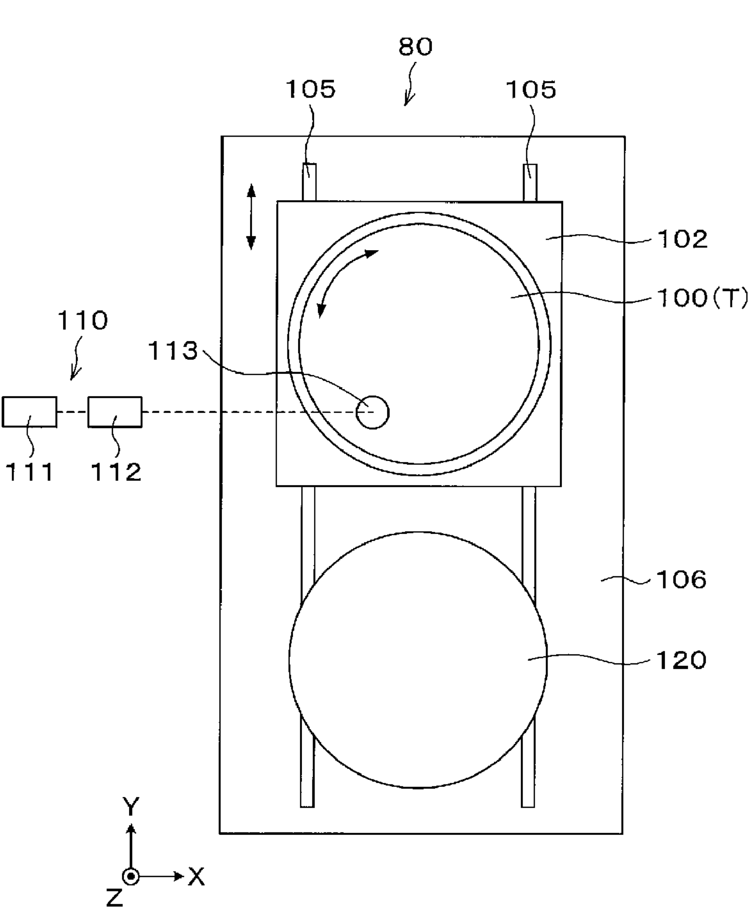
FIG. 4 is a plan view illustrating a schematic configuration of the interfacial laser radiation device.

As illustrated in FIG. 3 and FIG. 4, the interfacial laser radiation device 80 includes a chuck 100 configured to hold the combined wafer T on a top surface thereof. The chuck 100 is configured to attract and hold a part or the whole of the rear surface W1*b* of the first wafer W1. The chuck 100 is provided with a lifting pin (not shown) for delivering the combined wafer T to/from the transfer arm 42. The lifting pin is configured to be movable up and down through a through hole (not shown) formed through the chuck 100, and serves to move the combined wafer T up and down while supporting the combined wafer T from below.

The chuck 100 is supported by a slider table 102 with an air bearing 101 therebetween. A rotating mechanism 103 is provided on a bottom surface of the slider table 102. The rotating mechanism 103 incorporates therein, for example, a motor as a driving source. The chuck 100 is configured to be rotated about a 0 axis (vertical axis) by the rotating mechanism 103 via the air bearing 101 therebetween. The slider table 102 is configured to be moved by a moving mechanism 104, which is provided on a bottom surface side thereof, along a rail 105 which is provided on a base 106 and elongated in the Y-axis direction. In addition, though not particularly limited, a driving source of the moving mechanism 104 may be, by way of non-limiting example, a linear motor.

A laser radiation unit 110 is provided above the chuck 100. The laser radiation unit 110 has a laser head 111, an optical system 112, and a lens 113. The laser head 111 is configured to oscillate a laser beam in a pulse shape. The optical system 112 is configured to adjust an output of the laser beam by controlling the intensity or the position of the laser beam or by attenuating the laser beam. The lens 113 is a cylindrical member and is configured to radiate the laser beam to the combined wafer T held by the chuck 100. In the present exemplary embodiment, the laser beam is a $CO_2$ laser beam in a pulse shape, and the laser beam emitted from the laser radiation unit 110 is transmitted through the second wafer W2 to be radiated to the laser absorption layer P. The $CO_2$ laser beam has a wavelength ranging from, e.g., 8.9 μm to 11 μm. Further, the lens 113 is configured to be movable up and down by an elevating mechanism (not shown).

Further, a transfer pad 120 having, on a bottom surface thereof, an attraction surface for attracting and holding the rear surface W2*b* of the second wafer W2 is provided above the chuck 100. The transfer pad 120 is configured to be movable up and down by an elevating mechanism (not shown). The transfer pad 120 transfers the second wafer W2 between the chuck 100 and the transfer arm 42. Specifically, after the chuck 100 is moved to a position (a transfer position with respect to the transfer arm 42) below the transfer pad 120, the transfer pad 120 is lowered to attract and hold the rear surface W2*b* of the second wafer W2. Then, the transfer pad 120 is raised again to separate the second wafer W2 from the first wafer W1. The separated second wafer W2 is transferred from the transfer pad 120 to the transfer arm 42, and is carried out from the interfacial laser radiation device 80. Further, the transfer pad 120 may be configured to turn a front surface and a rear surfaces of a wafer upside down by an inverting mechanism (not shown).

Now, a wafer processing performed by using the wafer processing system 1 having the above-described configuration will be discussed. The following description will be provided for a case where a laser lift-off processing is performed in the wafer processing system 1, that is, a case where the device layer D2 of the second wafer W2 is transcribed to the first wafer W1. Further, in the present exemplary embodiment, the first wafer W1 and the second wafer W2 are bonded in a bonding apparatus (not shown) outside the wafer processing system 1 to prepare the combined wafer Tin advance.

First, the cassette Ct accommodating therein the plurality of combined wafers T is placed on the cassette placing table 10 of the carry-in/out block G1. Then, the combined wafer T in the cassette Ct is taken out by the wafer transfer device 20. The combined wafer T taken out from the cassette Ct is transferred to the wafer transfer device 40 via the transition device 30, and then transferred to the interfacial laser radiation device 80. In the interfacial laser radiation device 80, the second wafer W2 is separated from the first wafer W1 (subjected to the laser trim-off processing).

Specifically, the combined wafer T attracted to and held by the chuck 100 from the transfer arm 42 via the lifting pin is first moved to a processing position by the moving mechanism 104. This processing position is a position where laser beam can be radiated from the laser radiation unit 110 to the combined wafer T (laser absorption layer P).

Figure 5:
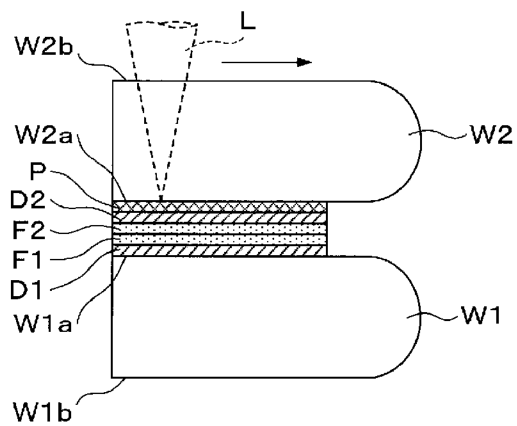
FIG. 5 is an explanatory diagram illustrating a state in which a separation modification layer according to an exemplary embodiment is being formed.
Figure 6:
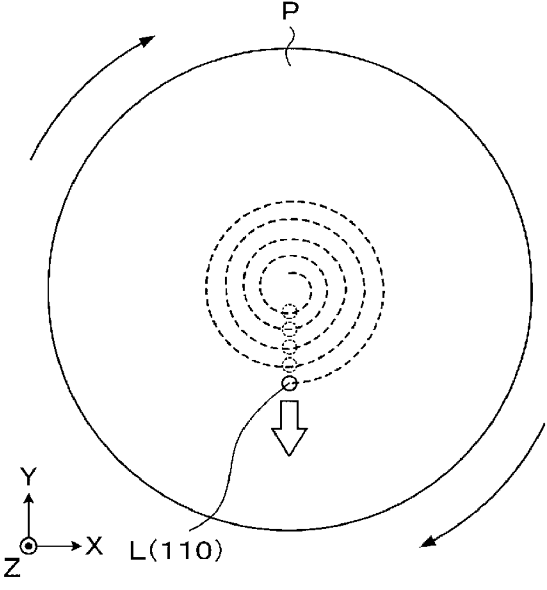
FIG. 6 is a plan view illustrating an example of forming the separation modification layer according to the exemplary embodiment.

Subsequently, as shown in FIG. 5 and FIG. 6, a laser beam L ($CO_2$ laser beam) is radiated in a pulse shape from laser radiation unit 110 toward the rear surface W2*b* of the second wafer W2. At this time, the laser beam L penetrates the second wafer W2 from the rear surface W2*b* side of the second wafer W2, and is absorbed by the laser absorption layer P. A stress is generated in the laser absorption layer P that has absorbed the laser beam L. Hereinafter, a stress accumulation layer which is formed as a result of the radiation of the laser beam and which is to serve as a starting point for the separation of the second wafer W2 (a starting point for the transcription of the device layer D2) will sometimes be referred to as "separation modification layer M1". Further, almost all the energy of the laser beam L radiated to the laser absorption layer P is absorbed through the formation of the separation modification layer M1, and does not reach the device layer D2. Therefore, damage to the device layer D2 can be suppressed.

Here, the laser beam L radiated to the laser absorption layer P is controlled to have an output power that does not cause the second wafer W and the laser absorption layer P to be separated by the radiation of the laser beam L. That is, by increasing the frequency of the laser beam L, for example, the peak power is lowered, and the separation modification layer M1 is formed so that the second wafer W2 and the laser absorption layer P are not separated by the radiation of the laser beam L.

In this way, by suppressing the generated stress from being escaped while not causing the separation of the second wafer W2 and the laser absorption layer P by the radiation of the laser beam L, the generated stress is accumulated in the laser absorption layer P, whereby the separation modification layer M1 is formed. As a more specific example, by gasifying the laser absorption layer P through the radiation of the laser beam and suppressing the generated gas from being escaped as described above, a compressive stress is accumulated as the separation modification layer M1. Furthermore, as an example, heat is generated in the laser absorption layer P by the absorption of the laser beam, and a shear stress is accumulated as the separation modification layer M1 due to a difference in thermal expansion coefficients of the laser absorption layer P and the second wafer W2 or device layer D2. In addition, by accumulating the stress generated by the radiation of the laser beam without causing the separation of the second wafer W2 and the laser absorption layer P as stated above, the bonding strength between the laser absorption layer P and the second wafer W2 is reduced at the position where the separation modification layer M1 is formed.

Further, when radiating the laser beam L to the laser absorption layer P, the chuck 100 (combined wafer T) is rotated by the rotating mechanism 103, and the chuck 100 is moved in the Y-axis direction by the moving mechanism 104. Accordingly, the laser beam L is radiated to the laser absorption layer P from the diametrically inner side toward the diametrically outer side thereof. As a result, the laser beam L is radiated in a spiral shape from the inner side toward the outer side. Further, black-colored arrows shown in FIG. 6 indicate a rotation direction of the chuck 100.

Figures 7A, 7B, 7C:
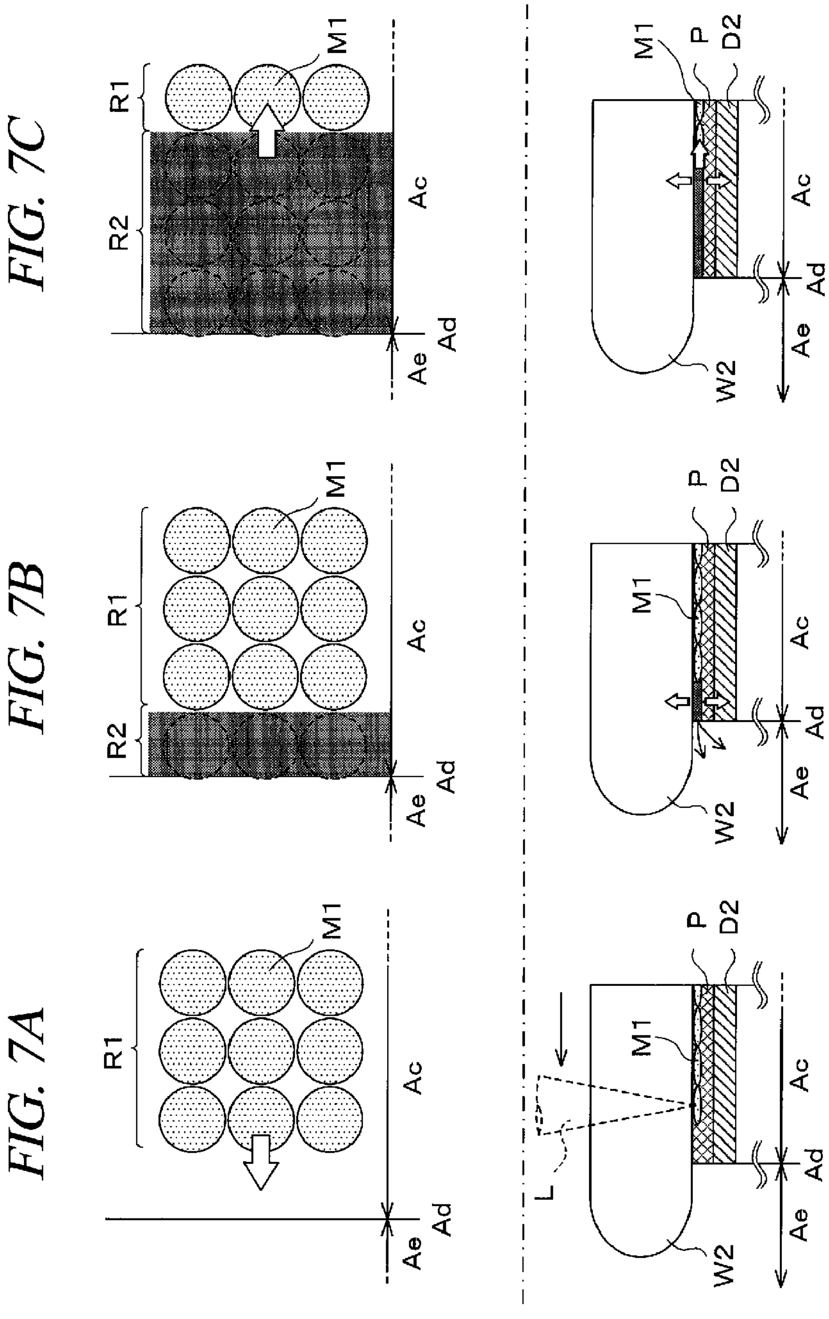
FIG. 7A to FIG. 7C are explanatory diagrams illustrating a sequence of a wafer processing according to the exemplary embodiment.

Here, the formation interval of the neighboring separation modification layers M1, that is, a pulse interval (frequency) of the laser beam L is controlled to be an interval at which separation does not occur between the neighboring separation modification layers M1 due to an impact generated when those separation modification layers M1 are formed. As an example, as shown in FIG. 7A, it is desirable that the neighboring separation modification layers M1 are formed so as not to overlap each other when viewed from the top. Furthermore, at this time, it is desirable that the neighboring separation modification layers M1 are formed adjacent to each other.

Further, as shown in FIG. 8, in the laser absorption layer P, the laser beam L may be annularly radiated in concentric circles. In this case, however, since the rotation of the chuck 100 and the movement of the chuck 100 in the Y direction are alternately performed, it may be more desirable to radiate the laser beam L in the spiral shape as described above as it reduces the radiation time and thus improve throughput.

In addition, in the present exemplary embodiment, the chuck 100 is rotated when radiating the laser beam L to the laser absorption layer P. However, it may be possible to move the lens 113 instead, thus allowing the lens 113 to be rotated relative to the chuck 100. Further, although the chuck 100 is moved in the Y-axis direction, the lens 113 may be moved in the Y-axis direction. Moreover, the direction in which the separation modification layer M1 is formed is not limited to the direction from the diametrically inner side to the diametrically outer side of the laser absorption layer P, but it may be formed in a direction from the diametrically outer side toward the diametrically inner side.

If separation modification layers M1 are successively formed in this way, a region (hereinafter, referred to as "non-separation region R1") in which the separation modification layers M1 are formed without accompanying the separation of the second wafer W2 and the laser absorption layer P is sequentially formed from the diametrically inner side toward the diametrically outer side of the laser absorption layer P, as illustrated in FIG. 7A. In the non-separation region R1, the stress generated in the formation of the individual separation modification layers M1 is accumulated as described above.

If the formation of the non-separation region R1 is continued, the formation position of the separation modification layer M1 reaches the vicinity of an end portion of the second wafer W2, that is, a boundary Ad between a bonding region Ac where the first wafer W1 and the second wafer W2 are bonded and a non-bonding region Ae at the diametrically outer side of the bonding region Ac, as depicted in FIG. 7B. Here, the boundary Ad may be, for example, a bonding end portion formed by bonding the first wafer W1 and the second wafer W2. By way of example, the boundary Ad may be a portion intentionally formed by removing a bonding interface between the first wafer W1 and the second wafer W2. That is, the non-bonding region Ae is an area at an outer side than the boundary Ad in the diametrical direction, where the bonding strength between the first wafer W1 and the second wafer W2 is intentionally removed by, for example, the removal of the bonding interface. For example, it may be simply a region on the diametrically outer side than the bonding region Ac where the first wafer W1 and the second wafer W2 are actually bonded.

Once the formation position of the separation modification layer M1 reaches the boundary Ad, the stress accumulated as the separation modification layer M1 is released to a space in which the non-bonding region Ae is formed, that is, to the outside of the combined wafer T. If the accumulated stress is released, a force is applied, at the position of the separation modification layer M1 formed near the boundary Ad, in a thickness direction of the laser absorption layer P, that is, in a separation direction of the laser absorption layer P and the second wafer W2, as illustrated in FIG. 7B, so that the laser absorption layer P and the second wafer W2 are separated.

Next, if the laser absorption layer P and the second wafer W2 are separated near the boundary Ad, the separation of the laser absorption layer P and the second wafer W2 proceeds in a diametrically inward direction of the laser absorption layer P by being affected by the force acting in the thickness direction of the laser absorption layer P due to the separation. The separation that has proceeded in the diametrically inward direction reaches the adjacent separation modification layer M1. That is, the separation of the laser absorption layer P and the second wafer W2 occurs at the formation position of the adjacent separation modification layer M1.

Once the separation occurs at the formation position of the adjacent separation modification layer M1, the stress accumulated as this separation modification layer M1 is released. Accordingly, a force acts in the thickness direction of the laser absorption layer P at the formation position of this separation modification layer M1, so that the separation of the laser absorption layer P and the second wafer W2 further proceeds in the diametrically inward direction.

As the separation of the laser absorption layer P and the second wafer W2, the release of the stress, and the progress of the separation in the diametrically inward direction are repeated in a chain manner in this way, a separation region R2 is sequentially formed from the diametrically outer side toward the diametrically inner side of the laser absorption layer P, as shown in FIG. 7C. Then, as the entire surface of the second wafer W2 is separated from the laser absorption layer P (first wafer W1), the device layer D2 of the second wafer W2 is transcribed to the first wafer W1.

According to the present exemplary embodiment, in the formation of the non-separation region R1, that is, in the continuous formation of the separation modification layers M1, the peak power (frequency) of the laser beam L is controlled such that the separation of the laser absorption layer P and the second wafer W2 does not take place. Then, as the separation modification layer M1 serving as the starting point for the separation (hereinafter, referred to as "starting point modification layer M1*s*") is formed near the boundary Ad, the separation of the laser absorption layer P and the second wafer W2 proceeds naturally starting from the separation modification layer M1 of the non-separation region R1. Therefore, since it is not necessary to reduce the frequency of the laser beam L in the separation of the laser absorption layer P and the second wafer W2, the time required for the transcription of the device layer D2 is shortened, that is, deterioration in throughput is suppressed. In addition, since it is not necessary to increase the peak power of the laser beam Las stated above, the energy efficiency required for the transcription of the device layer D2 can be improved.

If the entire surface of the second wafer W2 is separated from the laser absorption layer P, the chuck 100 is then moved to the delivery position by the moving mechanism 104. At the delivery position, the rear surface W2*b* of the second wafer W2 is attracted to and held by the transfer pad 120, as shown in FIG. 9A. Thereafter, by raising the transfer pad 120 as shown in FIG. 9B, the second wafer W2 is separated from the laser absorption layer P (the first wafer W1). At this time, since the separation has occurred at the interface between the laser absorption layer P and the second wafer W2 as stated above, the second wafer W2 can be separated from the laser absorption layer P without needing to apply a large load.

The separated second wafer W2 is delivered from the transfer pad 120 to the transfer arm 42 of the wafer transfer device 40, and is then transferred to the cassette Cw2 of the cassette placing table 10. Further, the front surface W2*a* of the second wafer W2 carried out from the interfacial laser radiation device 80 may be cleaned in the cleaning apparatus 60 before being transferred to the cassette Cw2.

Meanwhile, the first wafer W1 held by the chuck 100 is delivered to the transfer arm 42 of the wafer transfer device 40 via the lifting pin, and is then transferred to the cleaning apparatus 60. In the cleaning apparatus 60, the surface of the laser absorption layer P which is the separation surface is scrub-cleaned. In addition, in the cleaning apparatus 60, the rear surface W1*b* of the first wafer W1 may be cleaned together with the surface of the laser absorption layer P.

Thereafter, the first wafer W1 after being subjected to all the processes related to the transcription of the device layer D2 to the first wafer W1 is transferred to the cassette Cw1 of the cassette placing table 10 by the wafer transfer device 20 via the transition device 30. Thus, the series of processes of the wafer processing in the wafer processing system 1 are ended.

According to the above-described exemplary embodiment, the output of the laser beam L radiated by the interfacial laser radiation device 80 is controlled to the peak power which does not cause the separation of the laser absorption layer P and the second wafer W2. That is, since it is not necessary to lower the frequency of the laser beam L in the separation of the laser absorption layer P and the second wafer W2, the decrease in throughput regarding the transcription of the device layer D2 to the first wafer W1 is suppressed. In addition, even when the peak power of the laser beam L is lowered in this way, the separation of the laser absorption layer P and the second wafer W2 can be carried out appropriately by releasing the stress accumulated by the formation of the separation modification layer M1.

Further, in the above-described exemplary embodiment, by releasing the stress through the formation of the separation modification layer M1 near the boundary Ad as the starting point modification layer M1*s*, the separation of the laser absorption layer P and the second wafer W2 in a chain manner is begun. However, the way to start the separation is not limited thereto.

Specifically, by forming the starting point modification layer M1*s* serving as the starting point for the separation at the outside of the non-separation region R1 formed in the laser absorption layer P, the separation of the laser absorption layer P and the second wafer W2 in a chain manner may be started. At this time, the starting point modification layer M1*s* is formed with a high peak power (low frequency) at which the laser absorption layer P and the second wafer W2 are separated by the radiation of the laser beam L. In this way, by causing the separation through the radiation of the laser beam L, the compressive stress is released, and, thereafter, the laser absorption layer P and the second wafer W2 are sequentially separated. Furthermore, even when the frequency is lowered in order to increase the peak power for the formation of the starting point modification layer M1*s* in this way, the non-separation region R1 can be formed by the same method as in the above-described exemplary embodiment. Therefore, it is possible to suppress the decrease in throughput regarding the transcription of the device layer D2 to the first wafer W1.

Moreover, in this case, the starting point modification layer M1*s* may be formed prior to the formation of the non-separation region R1. That is, by separating the laser absorption layer P and the second wafer W2 in advance through the formation of the starting point modification layer M1*s*, the formation position of the separation modification layer M1 as the non-separation region R1 reaches the formation position of the starting point modification layer M1*s*, so that the compressive stress is released in the starting point modification layer M1*s*, and the separation in a chain manner can be started.

Here, in order to perform the separation of the laser absorption layer P and the second wafer W2 in a uniform manner in the surfaces thereof, it is desirable to set the interval of radiating the laser beam L, that is, the pulse interval to be constant. However, when the chuck 100 (combined wafer T) is rotated in the radiation of the laser beam L as stated above, the rotation speed of the chuck 100 relative to the laser radiation unit 110 (lens 113) on the diametrically inner side becomes larger than the rotation speed on the diametrically outer side. That is, even when the rotation speed of the chuck 100 is constant, if the laser beam L is radiated to the diametrically inner side, the interval between the laser beams L becomes small, and those laser beams L may be overlapped at the central portion of the laser absorption layer P. If the laser beams L overlap in this way, the laser absorption layer P and the second wafer W2 may not be appropriately separated at the central portion, or some of the laser beams L may penetrate the laser absorption layer P, thus affecting the device layer D2.

Figure 10:
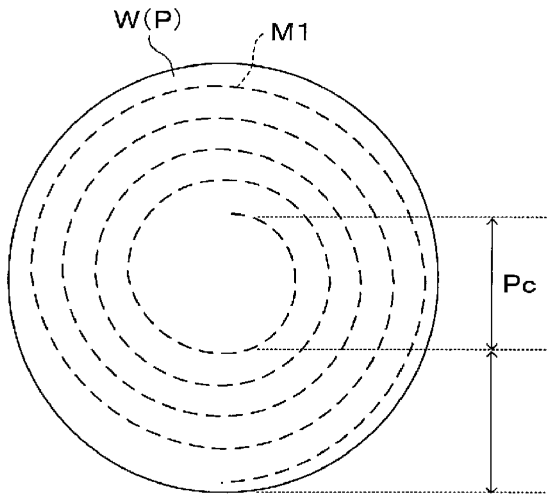
FIG. 10 is a plan view illustrating yet another example of forming the separation modification layer according to the exemplary embodiment.

Thus, according to the present exemplary embodiment, in the separation of the second wafer W2 and the laser absorption layer P, the formation of the separation modification layer M1 may be omitted in a central portion Pc of the laser absorption layer P within a range in which the separation region R2 is naturally formed and expanded by the release of the stress, as shown in FIG. 10. In this way, even when the separation modification layer M1 is not formed in the central portion of the laser absorption layer P, separation proceeds by the action of the separation (stress release) proceeding from the diametrically outer side, so that the laser absorption layer P and the second wafer W2 can be separated in the central portion.

Moreover, in the present exemplary embodiment, by setting the frequency of the laser beam L to be small on the diametrically inner side where the relative rotation speed of the chuck 100 with respect to the laser radiation unit 110 (lens 113) becomes large while setting the frequency of the laser beam L1 to be large on the diametrically outer side, the relative radiation interval of the laser beam L to the laser absorption layer P may be controlled to be substantially constant. However, in the case of changing the frequency in this way, if the frequency of the laser beam L is changed in a laser oscillator of the laser head 111, the pulse waveform of the laser beam L is also changed. Therefore, complicated adjustment in consideration of the output or the pulse waveform of the laser beam L is required, making it difficult to control the process of laser processing.

Therefore, in the present exemplary embodiment, the frequency of the laser beam L is controlled by using an acousto-optic modulator. As described above, the laser radiation unit 110 includes the laser head 111, the optical system 112 and the lens 113.

Figure 11:
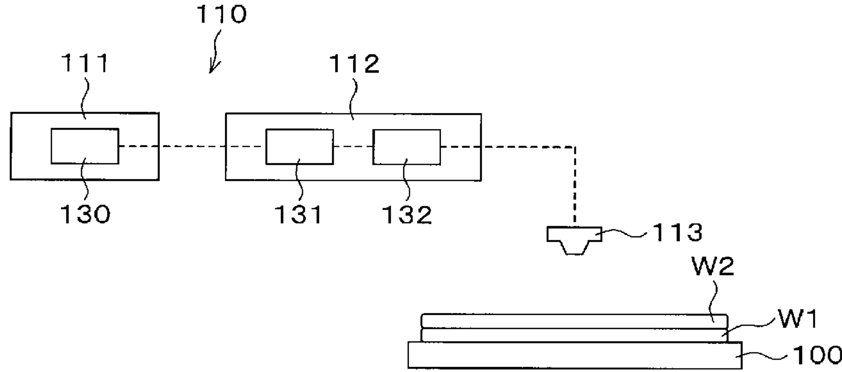
FIG. 11 is an explanatory diagram schematically illustrating a configuration of a laser radiation unit according to another exemplary embodiment.

As shown in FIG. 11, the laser head 111 has a laser oscillator 130 configured to oscillate the laser beam in the pulse shape. The frequency of the laser beam oscillated from the laser oscillator 130 is the highest frequency that can be allowed to be controlled by an acousto-optic modulator (AOM) 131 to be described later. Also, the laser head 111 may have other devices, for example, an amplifier, in addition to the laser oscillator 130.

The optical system 112 includes the acousto-optic modulator (AOM) 131 as an optical element configured to divert the laser beam from the laser oscillator 130 in a different direction and an attenuator 132 configured to attenuate the laser beam from the laser oscillator 130 and adjust the output of the laser beam. The acousto-optic modulator 131 and the attenuator 132 are provided in this order from the laser oscillator 130.

Figure 12:
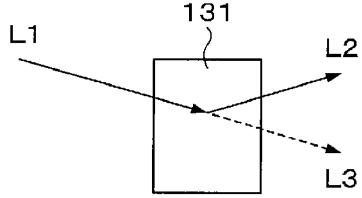
FIG. 12 is an explanatory diagram illustrating a state in which a frequency of a laser beam is changed by an acousto-optic modulator according to the another exemplary embodiment.

The acousto-optic modulator 131 is an optical modulator configured to electrically control the intensity and the position of the laser beam at a high speed. As shown in FIG. 12, when the laser beam L1 from the laser oscillator 130 is incident, the acousto-optic modulator 131 applies a voltage to change the refractive index of the laser beam L1 and thus diverts the laser beam L1 in a different direction. Specifically, a changed angle of the laser beam L1 can be controlled by adjusting the voltage. In the present exemplary embodiment, for example, the laser beam L1 is diverted in two different directions, and a laser beam L2 in one direction is radiated to the laser absorption layer P and a laser beam L3 in the other direction is not radiated to the laser absorption layer P. By controlling the diversion of the laser beams L2 and L3, it is possible to adjust the frequency of the laser beam L2 radiated to the laser absorption layer P.

Figure 13A:
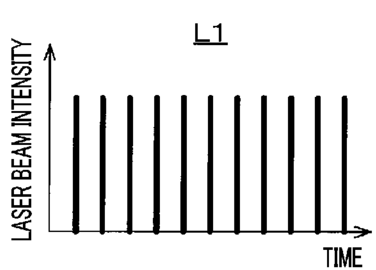
FIG. 13A and FIG. 13B are explanatory diagrams illustrating the state in which the frequency of the laser beam is changed by the acousto-optic modulator according to the another exemplary embodiment.
Figure 13B:
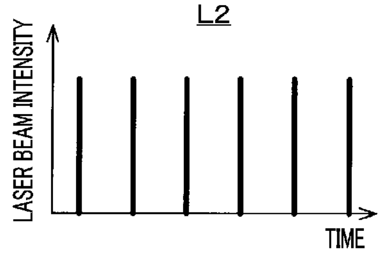

In this case, the frequency of the laser beam L2 radiated to the laser absorption layer P can be adjusted by thinning out the pulse of the laser beam L1 with the acousto-optic modulator 131. For example, if a diversion ratio of the laser beam L2 and the laser beam L3 to the laser beam L1 is set to 100:0 at a certain timing, the laser beam L1 becomes the laser beam L2 as it is and is radiated to the laser absorption layer P. If the diversion ratio of the laser beam L2 and the laser beam L3 to the laser beam L1 is set to 0:100 at another timing, the laser beam L2 has a value of 0 (zero) and the laser beam L2 is not radiated to the laser absorption layer P. In this case, the frequency of the laser beam L2 diverted by the acousto-optic modulator 131 shown in FIG. 13B can be adjusted with respect to the frequency of the laser beam L1 from the laser oscillator 130 shown in FIG. 13A. Further, as described above, since the frequency of the laser beam L1 is the highest frequency that can be allowed to be controlled by the acousto-optic modulator 131, the frequency of the laser beam L2 can be adjusted as required. The horizontal axis of FIG. 13A and FIG. 13B shows time, and the vertical axis shows the intensity of the laser beam L2. That is, the density of the graph in FIG. 13A and FIG. 13B indicates the frequency of the laser beam L2.

Moreover, in this case, since the frequency of the laser beam L1 oscillated from the laser oscillator 130 is not changed, the pulse waveform of the laser beam L1 is not changed. Thus, the pulse waveform of the laser beam L2 can be made identical to the pulse waveform of the laser beam L1. Therefore, it is possible to easily adjust the frequency of the laser beam L2 and it is not necessary to perform the conventional complicated adjustment as described above. Accordingly, it becomes easy to control the process of laser processing.

In the present exemplary embodiment, the acousto-optic modulator 131 is used as the optical element, but the present disclosure is not limited thereto. For example, an electro-optical modulator (EOM) may be used as the optical element. Further, an optical deflector such as an acousto-optic deflector (AOD) or an electro-optical deflector (EOD) may be used.

Hereinafter, a method of controlling the laser beam L2 when the laser radiation unit 110 radiates the laser beam L2 to the laser absorption layer P will be described. As described above, when a radiation position of the laser beam L2 is on the outer side in the diametrical direction of the laser absorption layer P, the frequency is increased, and when the radiation position of the laser beam L2 is on the inner side, the frequency is decreased.

Hereinafter, a specific example will be described. A numerical value in this specific example is an example, and the present disclosure is not limited to this numerical value. For example, the energy required for the separation on each of the outer side and inner side in the diametrical direction of the laser absorption layer P is set to 400 μJ. A required frequency of the laser beam L2 on the outer side in the diametrical direction of the laser absorption layer P is set to 100 kHz, and a required frequency of the laser beam on the inner side is set to 50 kHz. The frequency of the laser beam L1 from the laser oscillator 130 is set to 100 kHz and the output thereof is set to 40 W.

In this case, the pulse of the laser beam L1 from the laser oscillator 130 is not thinned out by the acousto-optic modulator 131 on the outer side in the diametrical direction of the laser absorption layer P. Then, the frequency of the laser beam L2 radiated to the laser absorption layer P becomes 100 kHz, which is identical to the frequency of the laser beam L1. Further, the output of the laser beam L2 becomes 40 W, which is identical to the output of the laser beam L1. Also, the energy of the laser beam L2 becomes 400 μJ (=40 W/100 kHz). Thus, the separation can be appropriately performed.

Meanwhile, the pulse of the laser beam L1 from the laser oscillator 130 is thinned out to half by the acousto-optic modulator 131 on the inner side in the diametrical direction of the laser absorption layer P. Then, the frequency of the laser beam L2 radiated to the laser absorption layer P becomes 50 kHz, which is half the frequency of the laser beam L1. Further, by thinning out the laser beam L1, the output of the laser beam L2 becomes 20 W, which is half the output of the laser beam L1. Also, the energy of the laser beam L2 becomes 400 μJ (=20 W/50 kHz). Thus, the separation can be appropriately performed.

As described above, the rotation speed of the chuck 100 is controlled to make the pulse interval uniform depending on the frequency and the radiation position of the laser beam L2. Then, at the central portion of the laser absorption layer P, the maximum rotation speed of the chuck 100 is maintained and the acousto-optic modulator 131 adjusts the frequency of the laser beam L2 according to the maximum rotation speed. Accordingly, the laser processing can be performed while the high rotation speed of the chuck 100 and the high frequency of the laser beam L2 are maintained. Thus, the laser processing can be implemented with the high throughput.

Moreover, in this case, since the frequency of the laser beam L1 from the laser oscillator 130 is not changed, the pulse waveform of the laser beam L1 is not changed. Thus, the pulse waveform of the laser beam L2 can be made identical to the pulse waveform of the laser beam L1. Therefore, the frequency of the laser beam L2 can be easily adjusted, which makes it possible to perform a continuous seamless process. As a result, it becomes easy to control the process of laser processing and it is possible to implement a stable process.

In the present exemplary embodiment, since the output of the laser beam L1 from the laser oscillator 130 is 40 W, it is not necessary to adjust the output with respect to the energy of 400 μJ required for the separation. In this respect, for example, when the output of the laser beam L1 is 50 W, the attenuator 132 may attenuate the output of the laser beam L1 by 20% to adjust the output.

Figure 14:
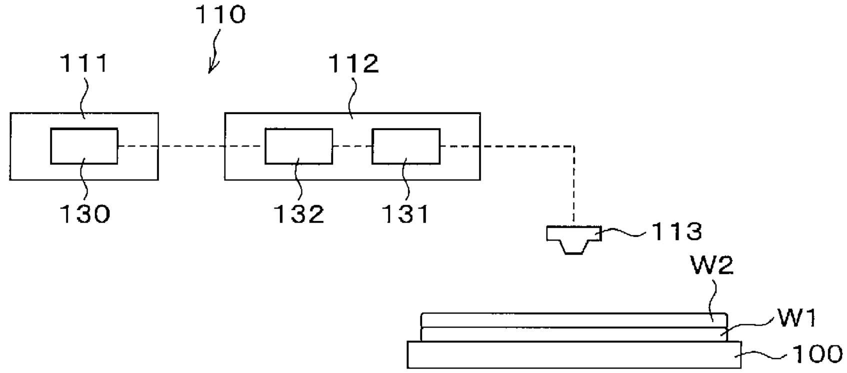
FIG. 14 is an explanatory diagram schematically illustrating a configuration of a laser radiation unit according to yet another exemplary embodiment.
Figures 15, 16A, 16B:
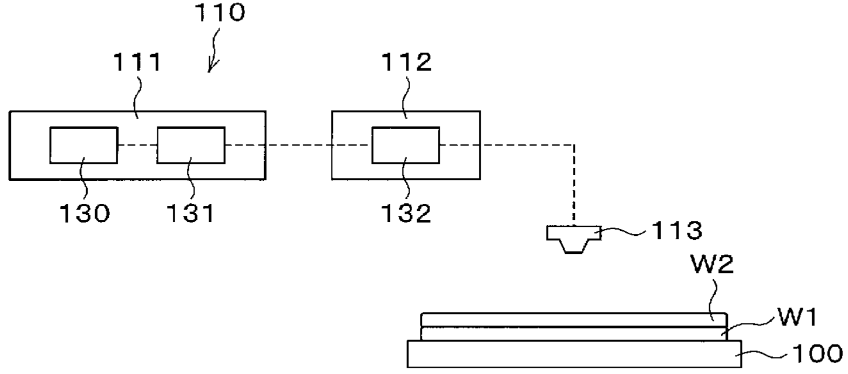
FIG. 15 is an explanatory diagram schematically illustrating a configuration of a laser radiation unit according to still yet another exemplary embodiment.
FIG. 16A and FIG. 16B are explanatory diagrams illustrating a separation modification layer formed according to the present exemplary embodiment.

In the laser radiation unit 110 according to the above-described exemplary embodiment, the acousto-optic modulator 131 is provided on an upstream side of the attenuator 132 inside the optical system 112, but the installation position is not limited thereto. For example, as shown in FIG. 14, the acousto-optic modulator 131 may be provided on a downstream side of the attenuator 132 inside the optical system 112. Alternatively, for example, as shown in FIG. 15, the acousto-optic modulator 131 may be provided on a downstream side of the laser oscillator 130 inside the laser head 111. Further, the acousto-optic modulator 131 may be provided at two or more of the above-described installation positions.

In the laser radiation unit 110, after the acousto-optic modulator 131 adjusts the frequency and output of the laser beam L2, the attenuator 132 can finely adjust the output. Herein, the output of the laser beam L1 oscillated from the laser oscillator 130 may become non-uniform depending on the individual difference of the laser oscillator 130. The attenuator 132 can correct the non-uniformity in output. Further, when the output of the laser beam L1 from the laser oscillator 130 is monitored over time, the attenuator 132 can be feedback-controlled to adjust the output. Also, from the viewpoint of finely adjusting the output of the laser beam L2 by the attenuator 132, the acousto-optic modulator 131 is preferably provided on the upstream side of the attenuator 132 as shown in FIG. 11.

The attenuator 132 may be omitted from the laser radiation unit 110 according to the above-described exemplary embodiment. For example, the output of the laser beam L2 may be adjusted by the acousto-optic modulator 131 instead of the attenuator 132. For example, if the output of the laser beam L1 is 50 W and the output of the laser beam L2 required for separation is 40 W, the AOM 131 may adjust the diversion ratio of the laser beam L2 and the laser beam L3 to the laser beam L1 to 80:20 to set the output of the laser beam L2 to 40 W.

Further, in the above-described exemplary embodiment, the separation modification layer M1 in which the bonding strength between the second wafer W2 and the laser absorption layer P is lowered is formed in the laser absorption layer P, and the separation of the second wafer W2 and the laser absorption layer P is performed starting from this separation modification layer M1. However, if a region to which the laser beam is not radiated and in which the bonding strength is not reduced (hereinafter referred to as "non-formation region R3") is formed in the surface of the laser absorption layer P as shown in FIG. 16A, for example, the second wafer W2 and the laser absorption layer P may not be properly separated in some cases. Specifically, in the non-formation region R3 in which the bonding strength is not reduced, a part (silicon piece) of the second wafer W2 may be left on the surface of the laser absorption layer P after being separated, as illustrated in FIG. 16B, for example.

Figures 17A, 17B:
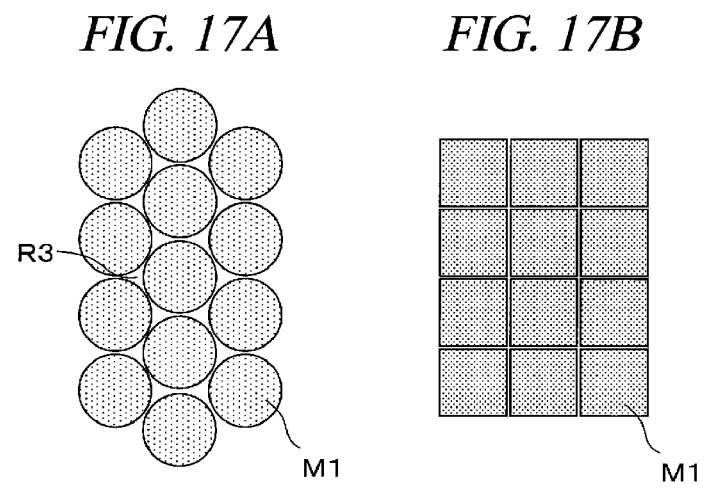

Therefore, in the present exemplary embodiment, it is desirable to form the separation modification layer M1 (non-separation region R1) such that the formation area of the non-formation region R3 may be reduced in the surface of the laser absorption layer P. Specifically, as shown in FIG. 17A, for example, by controlling the formation position of the separation modification layer M1, the number of separation modification layers M1 adjacent to one separation modification layer M1 may be increased, so that the non-formation region R3 can be reduced. In addition, by controlling a laser radiation form with respect to the laser absorption layer P as shown in FIG. 17B, for example, the non-formation region R3 may be reduced. That is, the laser radiation form may be, for example, a rectangle. By reducing the area of the non-formation region R3 in this way, the area in the surface of the laser absorption layer P in which the bonding strength with respect to the second wafer W2 is reduced increases, and, as a result, the separation of the laser absorption layer P and the second wafer W2 can be properly carried out.

Figures 18A, 18B, 18C:
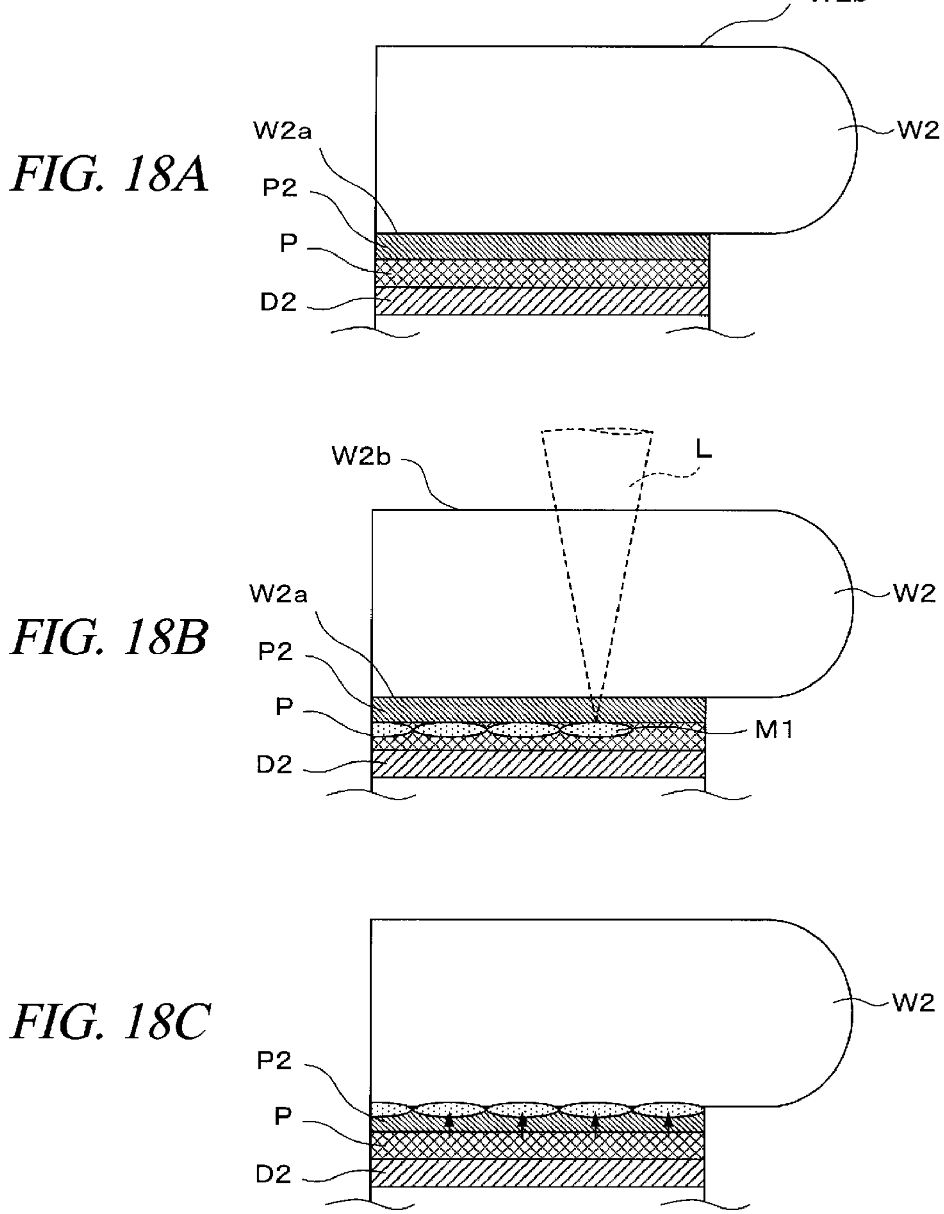
FIG. 18A to FIG. 18C are explanatory diagrams illustrating another example of separating the second wafer according to the exemplary embodiment.

Further, although the laser absorption layer P, the device layer D2, and the surface film F2 are stacked in this order on the front surface W2*a* of the second wafer W2 in the above-described exemplary embodiment, a separation facilitating layer P2 may be further formed between the second wafer W2 and the laser absorption layer P, as shown in FIG. 18A. As the separation facilitating layer P2, one which has transmittance to the laser beam ($CO_2$ laser) and whose adhesivity to the second wafer W2 (silicon) is at least smaller than adhesivity to the laser absorption layer P ($SiO_2$), for example, silicon nitride (SiN) is selected.

As depicted in FIG. 18B, in the transcription of the device layer D2 in the combined wafer T on which the separation facilitating layer P2 is formed, the laser beam L ($CO_2$ laser) is first radiated to the rear surface W2*b* of the second wafer W2 in a pulse shape. At this time, the laser beam L is transmitted through the second wafer W2 and the separation facilitating layer P2 from the rear surface W2*b* side of the second wafer W2, and is then absorbed by the laser absorption layer P. The separation modification layer M1 is formed in the laser absorption layer P that has absorbed this laser beam L.

Here, the stress generated by the radiation of the laser beam L usually stays in the radiation position of the laser beam L (in the laser absorption layer) as shown in the above-described exemplary embodiment to thereby form the separation modification layer M1. However, if the separation facilitating layer P2 is formed as in the present exemplary embodiment, the generated stress is transmitted through the separation facilitating layer P2 and is accumulated at the interface between the separation facilitating layer P2 and the second wafer W2, as illustrated in FIG. 18C, as the adhesivity between the separation facilitating layer P2 and the second wafer W2 is smaller than the adhesivity between the separation facilitating layer P2 and the laser absorption layer P. In other words, the stress generated by radiating the laser beam L is moved to and accumulates at the interface between the separation facilitating layer P2 and the second wafer W2 where it can more stably stay, so that the bonding strength between the separation facilitating layer P2 and the second wafer W2 is reduced.

Since the bonding strength between the separation facilitating layer P2 and the second wafer W2 is reduced in this way, the separation of the separation facilitating layer P2 and the second wafer W2 can be properly performed thereafter. At this time, since the adhesivity between the separation facilitating layer P2 and the second wafer W2 is low, it can be suppressed for a part of the second wafer W2 to be left on the surface of the separation facilitating layer P2 after being separated, as shown in FIG. 16B. In addition, since the laser beam is absorbed by the laser absorption layer P in the present exemplary embodiment, it is more appropriately suppressed that a damage is left on the exposed surface after the separation, that is, the front surface W2*a* of the second wafer W2 or the surface of the separation facilitating layer P2.

Also, when the separation is appropriately performed at the interface between the separation facilitating layer P2 and the second wafer W2 as described above, it is necessary for the gas generated by the radiation of the laser beam to pass through the separation facilitating layer P2. However, when the film thickness of the separation facilitating layer P2 is large, the generated gas may not properly pass through the separation facilitating layer P2, and the separation may occur at the interface between the separation facilitating layer P2 and the laser absorption layer P. Therefore, in order to properly perform the separation at the interface between the separation facilitating layer P2 and the second wafer W2, the film thickness of the separation facilitating layer P2 is thinner than that of the laser absorption layer P, specifically, about 1/10 of the film thickness of the laser absorption layer P. Thus, by setting the film thickness of the separation facilitating layer P2 to be small, the generated gas can pass through the separation facilitating layer P2 appropriately, and the second wafer W2 can be separated from the separation facilitating layer P2.

However, even if the film thickness of the separation facilitating layer P2 is large and the separation occurs at the interface between the separation facilitating layer P2 and the laser absorption layer P, it can be still suppressed that a part of the second wafer W2 is left on the surface of the laser absorption layer P after being separated as shown in FIG. 16B because the second wafer W2 is separated from the laser absorption layer P with the separation facilitating layer P2 therebetween. Thus, the front surface W2*a* of the second wafer W2 can be protected, and roughing of the separation surface can be suppressed.

In addition, in the above-described exemplary embodiment, one having low adhesivity with respect to the second wafer W2 (silicon) is used as the separation facilitating layer P. However, the one used for the separation facilitating layer P2 is not limited thereof. By way of example, one having a thermal expansion coefficient different from that of the second wafer W2 (silicon) may be used. In this case, the deformation amount caused by the heat generated by the radiation of the laser beam L to the laser absorption layer P is different between the second wafer W2 and the separation facilitating layer P2, whereby a shear force is generated at the interface between the second wafer W2 and the separation facilitating layer P2, so that the second wafer W2 and the separation facilitating layer P2 can be separated.

In addition, in the above-described exemplary embodiment, the separation of the second wafer W2 and the separation facilitating layer P2 is performed by the release of the compressive stress generated by the radiation of the laser beam and accumulated as the separation modification layer M1. However, the combined wafer T may be bent by the stress generated in this way. If the combined wafer T is bent in this way, there exists a likelihood that the wafer processing may not be performed properly. Thus, in order to suppress the bending of the combined wafer T, the combined wafer T may be pressed from above when the laser beam L is radiated to the laser absorption layer P.

Figure 19A:
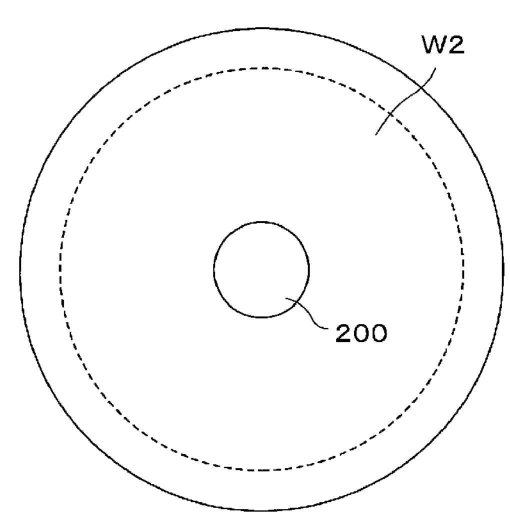
FIG. 19A and FIG. 19B are explanatory diagrams illustrating an operation of pressing the second wafer.
Figure 19B:
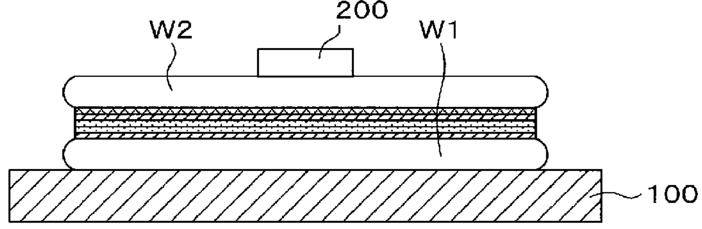

By way of example, when the combined wafer T is bent such that it is deformed into an upwardly convex shape, a central portion of the combined wafer T may be pressed by a pressing member 200 as shown in FIG. 19A and FIG. 19B. To elaborate, in the separation of the second wafer W2, a laser radiating process is previously performed on the central portion of the laser absorption layer P which falls within a pressing range by the pressing member 200, that is, the non-separation region R1 is formed thereat in advance. Once the non-separation region R1 is formed, the non-separation region R1 is pressed by the pressing member 200. Then, with the non-separation region R1 pressed by the pressing member 200, if the formation position of the non-separation region R1 reaches an outer peripheral end of the laser absorption layer P, the separation of the second wafer W2 in the chain manner is begun. At this time, since the central portion of the combined wafer T is pressed by the pressing member 200, the bending of the combined wafer T is suppressed.

In addition, the non-separation region R1 may be formed toward the diametrically inner side from the diametrically outer side. That is, the non-separation region R1 is first formed from the outer periphery of the laser absorption layer P toward the center thereof. At this time, the outer peripheral end which is the formation start position of the non-separation region R1 is defined on the slightly inner side than the outer peripheral end of the laser absorption layer P in the diametrical direction, and the stress is not released. Once the non-separation region R1 is formed, this non-separation region R1 is pressed by the pressing member 200. Thereafter, with the non-separation region R1 pressed by the pressing member 200, the formation position of the non-separation region R1 reaches the outer peripheral end of the laser absorption layer P. Thereafter, the separation in the chain manner is started by forming the starting point modification layer M1*s* on the diametrically outer side of the second wafer W2. At this time, since the central portion of the combined wafer T is pressed by the pressing member 200, the bending of the combined wafer T is suppressed.

Further, since the combined wafer T is rotated in the radiation of the laser beam L, it is desirable that an end of the pressing member 200 is configured to be rotated along with the combined wafer T.

Figure 20A:
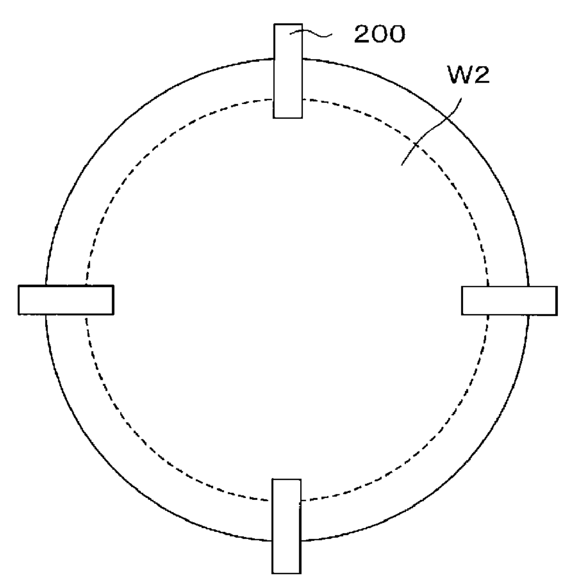
FIG. 20A and FIG. 20B are explanatory diagrams illustrating an operation of pressing the second wafer.
Figure 20B:
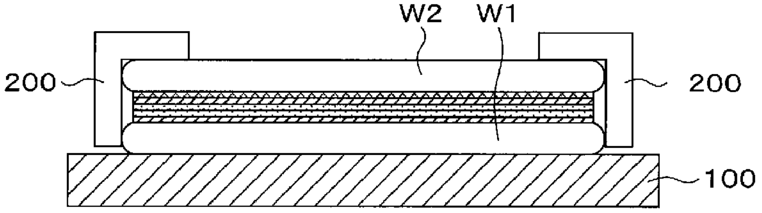

Further, when the combined wafer T is bent so that it is deformed into, for example, a downwardly convex shape, the peripheral portion We of the combined wafer T may be pressed by the pressing member 200, as shown in FIG. 20A and FIG. 20B. To elaborate, in the separation of the second wafer W2, the laser radiation processing is previously performed to form the separation region R2 at the outer peripheral portion of the laser absorption layer P which falls within the pressing range by the pressing member 200. Once the separation region R2 is formed, this separation region R2 is pressed by the pressing member 200. Then, with the separation region R2 pressed by the pressing member 200, the formation of the non-separation region R1 is begun at the central portion of the laser absorption layer P from the diametrically inner side toward the diametrically outer side. If the region where the non-separation region R1 is formed reaches the separation region R2, the separation of the second wafer W2 in the chain manner is begun. At this time, since the peripheral portion of the combined wafer T is pressed by the pressing member 200, the bending of the combined wafer T can be suppressed.

Figure 21:
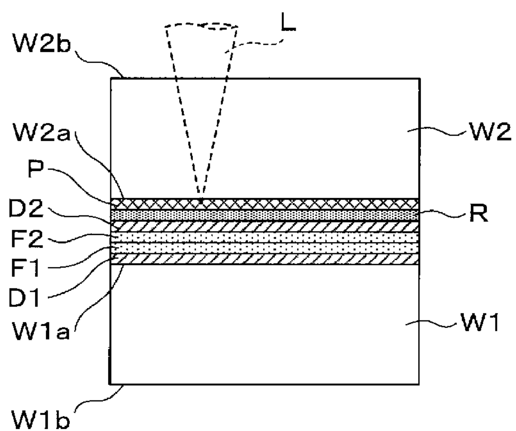
FIG. 21 is a side view schematically illustrating a structure of a combined wafer according to another exemplary embodiment.

Moreover, in the combined wafer T processed in the above-described exemplary embodiment, a reflection film R may be provided between the laser absorption layer P and the device layer D2 as shown in FIG. 21. That is, the reflection film R is formed on the surface of the laser absorption layer P opposite to the surface on which the laser beam L is incident. For the reflection film R, a material having a high reflectance with respect to the laser beam L and a high melting point, for example, a metal film is used. In addition, the device layer D2 is a layer which has a function, and is different from the reflection film R.

In this case, the laser beam L emitted from the laser radiation unit 110 is transmitted through the second wafer W2 and is almost completely absorbed in the laser absorption layer P. Even if the laser beam L cannot be fully absorbed, it is reflected by the reflection film R. As a result, the laser beam L does not reach the device layer D2, and the damage to the device layer D2 can be securely suppressed.

Further, the laser beam L reflected by the reflection film R is absorbed by the laser absorption layer P. Accordingly, the separation efficiency of the second wafer W2 may be improved.

In addition, although the above exemplary embodiment has been described for the case where the laser lift-off processing for the combined wafer T, that is, the processing of transcribing the device layer D2 to the first wafer W1 is performed in the wafer processing system 1, the edge trimming processing of the second wafer W2 can be performed in the wafer processing system 1 as mentioned above. Hereinafter, the case where the edge trimming of the second wafer W2 in the wafer processing system 1 is performed will be explained.

First, the combined wafer T is taken out by the wafer transfer device 20 from the cassette Ct disposed on the cassette placing table 10 of the carry-in/out block G1, and the taken combined wafer T is transferred to the wafer transfer device 40 through the transition device 30. Thereafter, it is transferred to the internal laser radiation device 70.

Figures 22A, 22B, 22C, 22D:
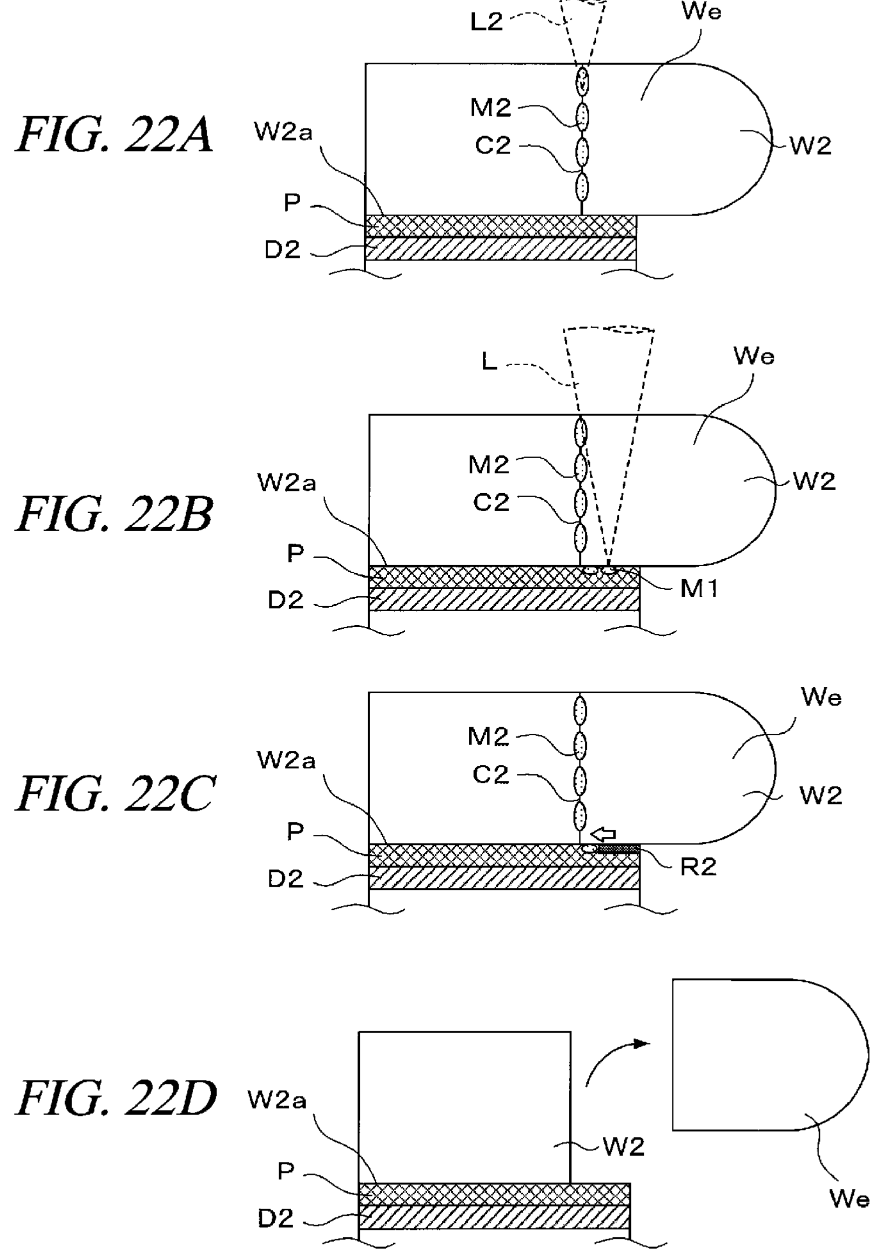
FIG. 22A to FIG. 22D are explanatory diagrams illustrating a sequence of an edge trimming processing according to the exemplary embodiment.

In the internal laser radiation device 70, laser beam L2 (YAG laser beam) is radiated to an inside of the second wafer W2 as shown in FIG. 22A to form a peripheral modification layer M2 to be used as a starting point when removing the peripheral portion We in the edge trimming to be described later. A crack C2 develops from the peripheral modification layer M2 in a thickness direction of the second wafer W2. An upper end and a lower end of the crack C2 reach, for example, the rear surface W2*b* and the front surface W2*a* of the second wafer W2, respectively. The combined wafer T in which the peripheral modification layer M2 is formed inside the second wafer W2 is then transferred to the interfacial laser radiation device 80 by the wafer transfer device 40.

In the interfacial laser radiation device 80, the bonding strength between the laser absorption layer P and the second wafer W2 at the peripheral portion We as a removing target portion of the second wafer W2 is reduced in the combined wafer T. To be specific, the laser beam L ($CO_2$ laser) is radiated to the laser absorption layer P as shown in FIG. 22B, and the separation modification layer M1 (non-separation region R1) is formed on the diametrically outer side than the peripheral modification layer M2 formed by the internal laser radiation device 70.

Further, in the formation of the separation modification layer M1 (non-separation region R1), the chuck 100 (combined wafer T) is rotated by the rotating mechanism 103, and the chuck 100 is moved in the Y-axis direction by the moving mechanism 104. Then, the laser beam L is radiated to the laser abruption layer P from the diametrically inner side toward the diametrically outer side, and, as a result, it is radiated in the spiral shape from the inner side to the outer side.

By carrying on the formation of the separation modification layer M1, if the formation position of the separation modification layer M1 reaches the vicinity of the end portion of the second wafer W2, that is, the boundary Ad, the separation from the diametrically outer side toward the diametrically inner side of the laser absorption layer P in the chain manner is started, as shown in FIG. 22C. Here, in the present exemplary embodiment, since the separation modification layer M1 is formed only on the diametrically outer side than the peripheral modification layer M2 (crack C2), the separation of the laser absorption layer P and the second wafer W2 proceeds only at the peripheral portion We, that is, on the diametrically outer side than the peripheral modification layer M2.

The combined wafer T in which the separation of the laser absorption layer P and the second wafer W2 at the peripheral portion We is completely separated is then transferred to the peripheral removing apparatus 50 by the wafer transfer device 40.

In the periphery removing apparatus 50, the peripheral portion We of the second wafer W2 is removed from the combined wafer T starting from the peripheral modification layer M2 and the crack C2 (edge trimming), as illustrated in FIG. 22D. Here, the way to perform the edge trimming in the periphery removing apparatus 50 may be selected as required. In removing the peripheral portion We, since the bonding strength between the second wafer W2 and the laser absorption layer P is lowered due to the formation of the separation modification layer M1, the removal of the peripheral portion We can be carried out easily.

The combined wafer T from which the peripheral portion We of the second wafer W2 has been removed is then transferred to the cleaning apparatus 60 by the wafer transfer device 40. In the cleaning apparatus 60, scrub cleaning of the combined wafer T is performed. Thereafter, the combined wafer T after being subjected to all the required processes is taken out from the cleaning apparatus 60 by the wafer transfer device 40, and transferred to the cassette Ct on the cassette placing table 10 by the wafer transfer device 20 via the transition device 30. In this way, the series of processes of the wafer processing in the wafer processing system 1 are ended.

As described above, according to the technique of the present disclosure, the bonding strength between the second wafer W2 and the laser absorption layer P at the peripheral portion We can be reduced by the interfacial laser radiation device 80, which makes it possible to appropriately perform the removal of the peripheral portion We, that is, the edge trimming in the periphery removing apparatus 50.

Additionally, the processing sequence of the combined wafer T by the internal laser radiation device 70 and the interfacial laser radiation device 80 is not limited to the example of the above-described exemplary embodiment. After the separation of the peripheral portion We is performed in the interfacial laser radiation device 80, the peripheral modification layer M2 may be formed in the internal laser radiation device 70.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to appropriately separate the second substrate from the first substrate in the combined substrate in which the first substrate and the second substrate are bonded to each other.

We claim:

1. A substrate processing method of a combined substrate in which a first substrate and a second substrate are bonded to each other, wherein a laser absorption layer is formed on the second substrate, and wherein the substrate processing method comprises:

forming a separation modification layer by radiating a laser beam to the laser absorption layer in a pulse shape;

radiating the laser beam in a pulse shape while forming the separation modification layer such that the separation modification layer does not overlap with another separation modification layer;

accumulating a stress in the laser absorption layer; and separating the second substrate by releasing the accumulated stress in a chain manner.

2. The substrate processing method of claim 1, wherein, in the forming of the separation modification layer, the separating of the laser absorption layer and the second substrate does not occur.

3. The substrate processing method of claim 1, further comprising:

forming a starting point modification layer serving as a starting point of the releasing of the stress in the chain manner.

4. The substrate processing method of claim 3, wherein the starting point modification layer is formed in the laser absorption layer at an end portion of a bonding region in which the first substrate and the second substrate are bonded, wherein in the forming of the starting point modification layer, a stress generated by the forming of the starting point modification layer is released to a non-bonding region, which is a region on a diametrically outer side of the bonding region, thus causing the laser absorption layer and the second substrate to be separated, and wherein the releasing of the stress in the chain manner is started by releasing the stress accumulated by the forming of the separation modification layer to a separation region formed by the forming of the starting point modification layer.

5. The substrate processing method of claim 1, wherein, in forming a starting point modification layer, the separating of the laser absorption layer and the second substrate is caused by radiating a laser beam, and wherein the releasing of the stress in the chain manner is started by releasing the stress accumulated by the forming of the separation modification layer to a separation region formed by the forming of the starting point modification layer.

6. The substrate processing method of claim 4, wherein the starting point modification layer is formed on an outer side than the separation modification layer in a diametrical direction.

7. The substrate processing method of claim 1, further comprising:

forming a peripheral modification layer along a boundary between a peripheral portion of the second substrate as a removing target and a central portion of the second substrate, wherein the separation modification layer is formed on an outer side than the peripheral modification layer in a diametrical direction.

8. The substrate processing method of claim 1, wherein the separation modification layer is not formed at a central portion of the laser absorption layer.

9. The substrate processing method of claim 1, wherein, by controlling a formation position of the separation modification layer and/or a radiation form of the laser beam when forming the separation modification layer, a formation area of the separation modification layer with respect to the laser absorption layer is increased.

10. The substrate processing method of claim 1, wherein a separation facilitating layer is formed between the second substrate and the laser absorption layer to facilitate separation of the second substrate.

11. The substrate processing method of claim 1, wherein, in the radiating of the laser beam to the laser absorption layer, a pulse-shaped laser beam is oscillated from a laser oscillator toward an optical element, and a frequency of the laser beam is adjusted in the optical element.

12. The substrate processing method of claim 11, wherein the frequency of the laser beam from the laser oscillator is a highest frequency that is allowed to be controlled by the optical element.

13. The substrate processing method of claim 11, wherein, in the radiating of the laser beam to the laser absorption layer, the laser beam from the laser oscillator is attenuated in an attenuator.

14. A substrate processing apparatus configured to process a combined substrate in which a first substrate and a second substrate are bonded to each other, wherein a laser absorption layer is formed on the second substrate, wherein the substrate processing apparatus comprises:

a laser radiation unit configured to radiate a laser beam in a pulse shape to the laser absorption layer of the second substrate; and a controller configured to control an operation of the laser radiation unit, and wherein the controller controls the operation of the laser radiation unit to perform formation of a separation modification layer by radiation of the laser beam, to radiate the laser beam in a pulse shape while forming the separation modification layer such that the separation modification layer does not overlap with another separation modification layer, and to accumulate a stress in the laser absorption layer by, and then, to perform separation of the second substrate by release of the accumulated stress in a chain manner.

15. The substrate processing apparatus of claim 14, wherein the controller controls an output of the laser beam such that the separation of the laser absorption layer and the second substrate does not occur in the formation of the separation modification layer.

16. The substrate processing apparatus of claim 14, wherein the controller controls the operation of the laser radiation unit to perform formation of a starting point modification layer serving as a starting point of the release of the stress in the chain manner.

17. The substrate processing apparatus of claim 16, wherein the controller controls the operation of the laser radiation unit:

to perform the formation of the starting point modification layer in the laser absorption layer at an end portion of a bonding region in which the first substrate and the second substrate are bonded;

to cause the separation of the laser absorption layer and the second substrate by release of a stress generated by the formation of the starting point modification layer to a non-bonding region on a diametrically outer side of the bonding region when the starting point modification layer is formed; and to start the release of the stress in the chain manner by releasing the stress accumulated by the formation of the separation modification layer to a separation region formed by the formation of the starting point modification layer.

18. The substrate processing apparatus of claim 16, wherein the controller controls an output of the laser beam to cause the separation of the laser absorption layer and the second substrate by the radiation of the laser beam when the starting point modification layer is formed, and wherein the controller controls the operation of the laser radiation unit to start the release of the stress in the chain manner by releasing the stress accumulated by the formation of the separation modification layer to a separation region formed by the formation of the starting point modification layer.

19. The substrate processing apparatus of claim 17, wherein the controller controls the operation of the laser radiation unit to form the starting point modification layer on an outer side than the separation modification layer in a diametrical direction.

20. The substrate processing apparatus of claim 14, further comprising:

a second laser radiation unit configured to form a peripheral modification layer along a boundary between a peripheral portion of the second substrate as a removing target and a central portion of the second substrate, wherein the controller controls the operation of the laser radiation unit to form the separation modification layer on an outer side than the peripheral modification layer in a diametrical direction.

21. The substrate processing apparatus of claim 14, wherein the controller controls the operation of the laser radiation unit such that the separation modification layer is not formed at a central portion of the laser absorption layer.

22. The substrate processing apparatus of claim 14, wherein the controller controls a formation position of the separation modification layer and/or a radiation form of the laser beam when forming the separation modification layer to increase a formation area of the separation modification layer with respect to the laser absorption layer.

23. The substrate processing apparatus of claim 14, wherein a separation facilitating layer is formed between the second substrate and the laser absorption layer to facilitate the separation of the second substrate.

24. The substrate processing apparatus of claim 14, further comprising:

a control unit configured to control the laser radiation unit, wherein the laser radiation unit comprises a laser oscillator configured to oscillate the laser beam in the pulse shape, and an optical element configured to divert the laser beam from the laser oscillator in a different direction, and wherein the control unit controls the optical element to adjust a frequency of the laser beam radiated to the laser absorption layer.

25. The substrate processing apparatus of claim 24, wherein the frequency of the laser beam from the laser oscillator is a highest frequency that is allowed to be controlled by the optical element.

26. The substrate processing apparatus of claim 24, wherein the laser radiation unit comprises an attenuator configured to attenuate the laser beam from the laser oscillator.

* * * * *